(12) United States Patent
Xie et al.

(10) Patent No.: US 9,390,939 B2
(45) Date of Patent: Jul. 12, 2016

(54) METHODS OF FORMING MIS CONTACT STRUCTURES FOR SEMICONDUCTOR DEVICES AND THE RESULTING DEVICES

(71) Applicants: GLOBALFOUNDRIES Inc., Grand Cayman (KY); International Business Machines Corporation, Armonk, NY (US)

(72) Inventors: Ruilong Xie, Niskayuna, NY (US); Xiuyu Cai, Niskayuna, NY (US); Kangguo Cheng, Schenectady, NY (US); Ali Khakifirooz, Mountain View, CA (US)

(73) Assignees: GLOBALFOUNDRIES Inc., Grand Cayman (KY); International Business Machines Corporation, Armonk, NY (US)

(*) Notice: Subject to any disclaimer, the term of this patent is extended or adjusted under 35 U.S.C. 154(b) by 128 days.

(21) Appl. No.: 14/289,737

(22) Filed: May 29, 2014

(65) Prior Publication Data

US 2015/0349083 A1    Dec. 3, 2015

(51) Int. Cl.
| | |
|---|---|
| *H01L 29/51* | (2006.01) |
| *H01L 21/3213* | (2006.01) |
| *H01L 21/02* | (2006.01) |
| *H01L 29/66* | (2006.01) |
| *H01L 21/768* | (2006.01) |
| *H01L 29/78* | (2006.01) |

(52) U.S. Cl.
CPC ...... *H01L 21/32133* (2013.01); *H01L 21/0214* (2013.01); *H01L 21/0217* (2013.01); *H01L 21/76838* (2013.01); *H01L 29/6659* (2013.01); *H01L 29/66643* (2013.01); *H01L 29/7833* (2013.01)

(58) Field of Classification Search
CPC ............... H01L 2924/0002; H01L 2924/00; H01L 21/28512; H01L 21/76831; H01L 21/823418; H01L 21/823431; H01L 21/823475; H01L 23/485; H01L 29/0895; H01L 29/41791; H01L 29/452; H01L 29/456; H01L 29/517
USPC ............. 257/E21.04, E29.255, E29.264, 288, 257/365, 369, 382, 384, 741, 751, 754
See application file for complete search history.

(56) References Cited

U.S. PATENT DOCUMENTS

| | | | |
|---|---|---|---|
| 8,110,877 B2 | 2/2012 | Mukherjee et al. | |
| 9,240,347 B2* | 1/2016 | Chandrashekar . | H01L 21/76877 |
| 2010/0155846 A1* | 6/2010 | Mukherjee ........ | H01L 21/28512 257/365 |

* cited by examiner

*Primary Examiner* — William F Kraig
*Assistant Examiner* — Edward Chin
(74) *Attorney, Agent, or Firm* — Amerson Law Firm, PLLC

(57) ABSTRACT

One method disclosed includes, among other things, conformably depositing a layer of contact insulating material and a conductive material layer in a contact opening, forming a reduced-thickness sacrificial material layer in the contact opening so as to expose a portion, but not all, of the conductive material layer, removing portions of the conductive material layer and the layer of contact insulating material positioned above the upper surface of the reduced-thickness sacrificial material layer, removing the reduced-thickness sacrificial material layer, and forming a conductive contact in the contact opening that contacts the recessed portions of the conductive material layer and the layer of contact insulating material.

14 Claims, 5 Drawing Sheets

METHODS OF FORMING MIS CONTACT STRUCTURES FOR SEMICONDUCTOR DEVICES AND THE RESULTING DEVICES

BACKGROUND OF THE INVENTION

1. Field of the Invention

The present disclosure generally relates to the fabrication of integrated circuits, and, more particularly, to various methods of forming MIS (Metal-Insulator-Semiconductor) contact structures for semiconductor devices and the resulting semiconductor devices.

2. Description of the Related Art

In modern integrated circuits, such as microprocessors, storage devices and the like, a very large number of circuit elements, especially transistors, are provided and operated on a restricted chip area. Transistors come in a variety of shapes and forms, e.g., planar transistors, FinFET transistors, nanowire devices, etc. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

Irrespective of whether a planar or non-planar device is considered, electrical connections must be formed to the device so that it may operate as intended. That is, electrical connection must be made to the source region, the drain region and the gate electrode of the device. Typically, the conductive structures that actually make contact with the device itself, i.e., the source region, the drain region and the gate electrode, are referred to as "contacts" within the industry. Such conductive contacts are formed in one or more layers of insulating material. The entire arrangement of the conductive contacts and the associated layer(s) of insulating material is sometimes referred to as the "contact level" of the overall electrical "wiring arrangement" that is formed to provide electrical connection to the integrated circuit device.

The ongoing decrease in device dimensions also mandated an associated decrease in physical size of the contact openings (and contacts) that are formed to establish electrical connections to, for example, the source/drain regions. That is, there is very little room in the contact openings for all of the layers of material that are needed when forming conductive contact structures. Device designers have explored using different contact methods and structures to improve the operational characteristics of the devices and/or to simplify processing techniques. For example, U.S. Pat. No. 8,110,887 is an example of an MIS (Metal-Insulator-Semiconductor) contact structure for silicon-based transistor devices. However, what is needed for modern, high packing density applications, is an MIS contact structure that is more efficient and effective in terms of its use of space and the formation of a lower resistance structure.

The present disclosure is directed to various methods of forming MIS contact structures for semiconductor devices and the resulting semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming MIS contact structures for semiconductor devices and the resulting semiconductor devices. One method disclosed includes, among other things, forming at least one layer of insulating material above a semiconductor layer, forming a contact opening in the layer of insulating material that exposes a portion of the semiconductor layer, conformably depositing a layer of contact insulating material in the contact opening and on the exposed surface of the semiconductor layer, conformably depositing a conductive material layer on the layer of contact insulating material within the contact opening, forming a sacrificial material layer in the contact opening on the conductive material layer such that it overfills the contact opening, reducing a thickness of the sacrificial material layer so as to expose a portion, but not all, of the conductive material layer, wherein the reduced-thickness sacrificial material layer of material has an upper surface, removing portions of the conductive material layer and the layer of contact insulating material positioned above the upper surface of the reduced-thickness sacrificial material layer so as to thereby define recessed portions of the conductive material layer and the layer of contact insulating material, removing the reduced-thickness sacrificial material layer, and forming a conductive contact in the contact opening that contacts the recessed portions of the conductive material layer and the layer of contact insulating material.

Another illustrative method disclosed herein includes, among other things, forming a layer of insulating material above a semiconductor layer, forming a contact opening in the layer of insulating material that exposes a portion of the semiconductor layer, conformably depositing a layer of contact insulating material on the sidewalls of the contact opening and on the exposed surface of the semiconductor layer, wherein the layer of contact insulating material has substantially vertically oriented portions and a substantially horizontally oriented portion, conformably depositing a conductive material layer on the layer of contact insulating material within the contact opening, wherein the conductive material layer has substantially vertically oriented portions and a substantially horizontally oriented portion, removing portions, but not all, of the vertically oriented portions of the conductive material layer and the vertically oriented portions of the layer of contact insulating material so as to thereby expose portions of the sidewalls of the contact opening, while leaving the horizontally oriented portion of the conductive material layer and the horizontally oriented portion of the layer of contact insulating material positioned within the contact opening above the semiconductor layer, and forming a conductive contact in the contact opening that contacts the conductive material layer and the layer of contact insulating material.

Yet another illustrative method disclosed herein includes, among other things, forming a contact opening that exposes a portion of a semiconductor layer, conformably depositing a layer of contact insulating material in the contact opening and on the exposed surface of the semiconductor layer, conformably depositing a conductive material layer on the layer of contact insulating material within the contact opening, forming a non-sacrificial conductive layer in the contact opening on the conductive material layer such that it overfills the contact opening, reducing a thickness of the non-sacrificial conductive layer so as to expose a portion, but not all, of the conductive material layer, wherein the reduced-thickness non-sacrificial conductive layer has an upper surface, removing portions of the conductive material layer and the layer of contact insulating material positioned above the upper surface of the reduced-thickness non-sacrificial conductive layer so as to thereby define recessed portions of the conductive material layer and the layer of contact insulating material, and forming a conductive contact in the contact opening that contacts the recessed portion of the conductive material layer, the recessed portion of the layer of contact insulating material and the reduced-thickness non-sacrificial conductive layer.

One illustrative device disclosed herein includes, among other things, a layer of semiconductor material, a layer of insulating material having a contact opening formed therein positioned above the layer of semiconductor material, a layer of contact insulating material having substantially vertically oriented portions and a substantially horizontally oriented portion, wherein the substantially vertically oriented portions of the layer of contact insulating material contact a portion, but not all, of the sidewalls of the contact opening and wherein the substantially horizontally oriented portion of the layer of contact insulating material contacts the semiconductor layer, a conductive material layer positioned on the layer of contact insulating material within the contact opening, the conductive material layer having substantially vertically oriented portions and a substantially horizontally oriented portion, wherein an uppermost surface of the conductive material layer and an uppermost surface of the layer of contact insulating material are positioned at approximately the same level within the contact opening, and a conductive contact positioned in the contact opening that contacts the uppermost surfaces of the conductive material layer and the layer of contact insulating material.

BRIEF DESCRIPTION OF THE DRAWINGS

The disclosure may be understood by reference to the following description taken in conjunction with the accompanying drawings, in which like reference numerals identify like elements, and in which.

Figure 1A:
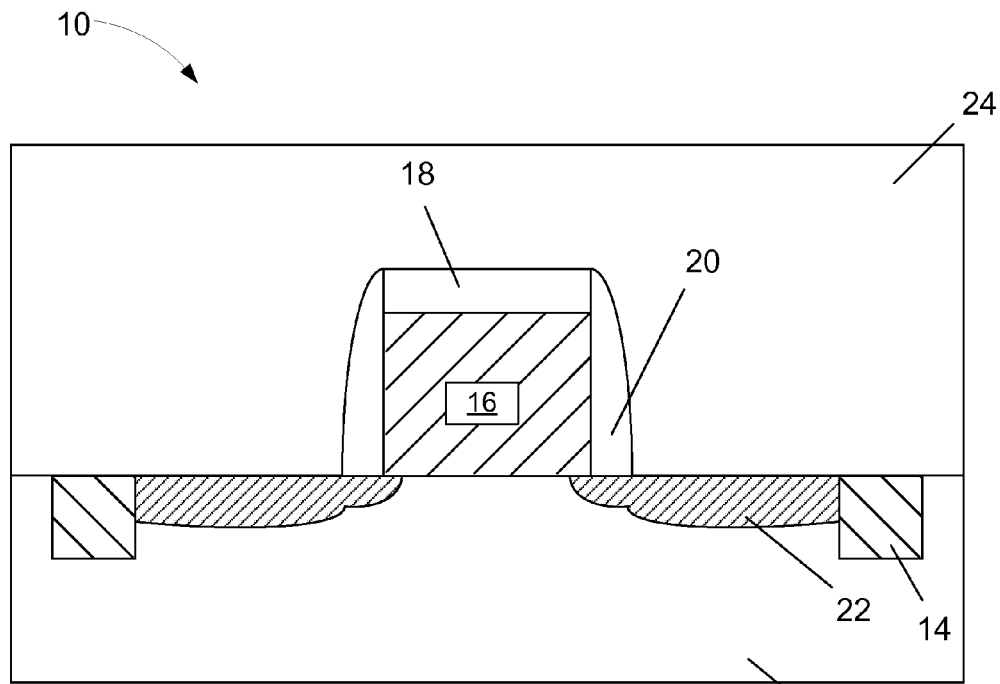
FIGS. 1A-1I depict various illustrative methods disclosed herein for forming MIS contact structures for semiconductor devices and the resulting semiconductor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming MIS contact structures for semiconductor devices and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc.

As will be appreciated by those skilled in the art after a complete reading of the present application, the inventions disclosed herein may be employed in forming integrated circuit products using planar transistor devices, as well as so-called 3D devices, such as FinFETs, nanowire devices, etc. For purposes of disclosure, reference will be made to an illustrative process flow wherein an illustrative planar transistor device is formed. However, the inventions disclosed herein should not be considered to be limited to such an illustrative example. With reference to the attached figures, various illustrative embodiments of the methods and devices disclosed herein will now be described in more detail. The gate structure for the device may be formed using either so-called "gate-first" or "replacement gate" ("gate-last" or "gate-metal-last") techniques. The various components and structures of the device 10 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIG. 1A is a simplified view of the illustrative transistor device 10 at an early stage of manufacturing. The device 10 is formed in an active region of a semiconductor substrate 12 that is defined by a simplistically depicted trench isolation region 14. The substrate 12 may have a variety of configurations, such as the depicted bulk silicon configuration. The substrate 12 may also have a silicon-on-insulator (SOI) configuration that includes a bulk silicon layer, a buried insulation layer and an active layer, wherein semiconductor devices are formed in and above the active layer. The substrate 12 may be made of silicon or it may be made of materials other than silicon. Thus, the terms "substrate" or "semiconductor substrate" should be understood to cover all semiconducting materials and all forms of such materials.

With continuing reference to FIG. 1A, the device 10 also includes a schematically depicted gate structure 16, a gate cap layer 18 (e.g., silicon nitride), sidewall spacers 20, source/drain regions 22 and an illustrative layer of insulating material 24. Although the layer of insulating material 24 is simplistically depicted as being a single layer of material, in practice, the layer of insulating material 24 may be comprised of a plurality of layers of insulating material, perhaps with an intervening etch stop layer formed between such layers of material. Additionally, various doped regions, e.g., halo implant regions, well regions and the like, are also not depicted in the attached drawings. A thin contact etch stop layer (not shown) may also be formed on the device prior to the formation of the layer of insulating material 24. The gate structure 16 is representative in nature of any type of gate structure used in manufacturing semiconductor devices. The gate structure 16 may be manufactured using gate-first or replacement gate techniques.

Figure 1B:
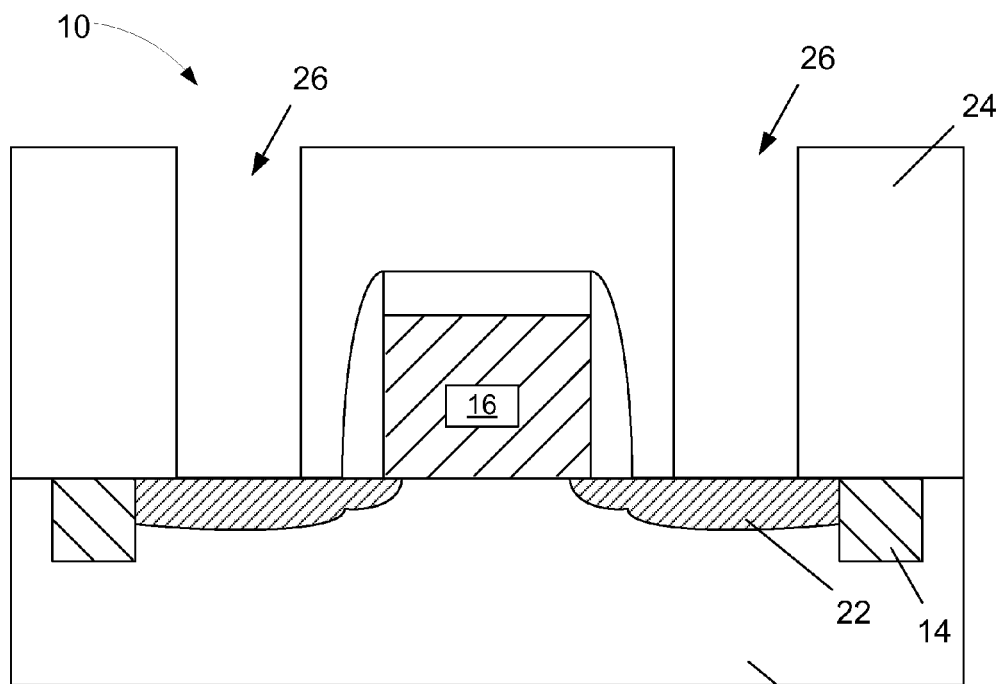

FIG. 1B depicts the device 10 after one or more etching processes were performed through a patterned etch mask (not shown), such as a patterned layer of photoresist or a patterned hard mask layer, to define illustrative contact openings or trenches 26 in the layer of insulating material 24. The size and shape of the contact openings may vary depending upon the particular application. For example, the contact openings 26 may be discreet pointtype contacts having a square or circular configuration or they may be line-type features that span the entire active region in the source/drain regions 22 of the device 10. In current day devices, the width of the contact openings 26 (in the gate length direction of the device 10) may be as small as about 10-30 nm, and further reductions in size are expected in future generation devices. The formation of the contact openings 26 exposes a portion of the source/drain regions 22. Of course, as will be appreciated by those skilled in the art after a complete reading of the present application, the methods disclosed herein may be employed when forming traditional contact structures as well as when forming so-called self-aligned contacts wherein the conductive contact structure lands on the gate cap layer as well as the sidewall spacer.

Figure 1C:
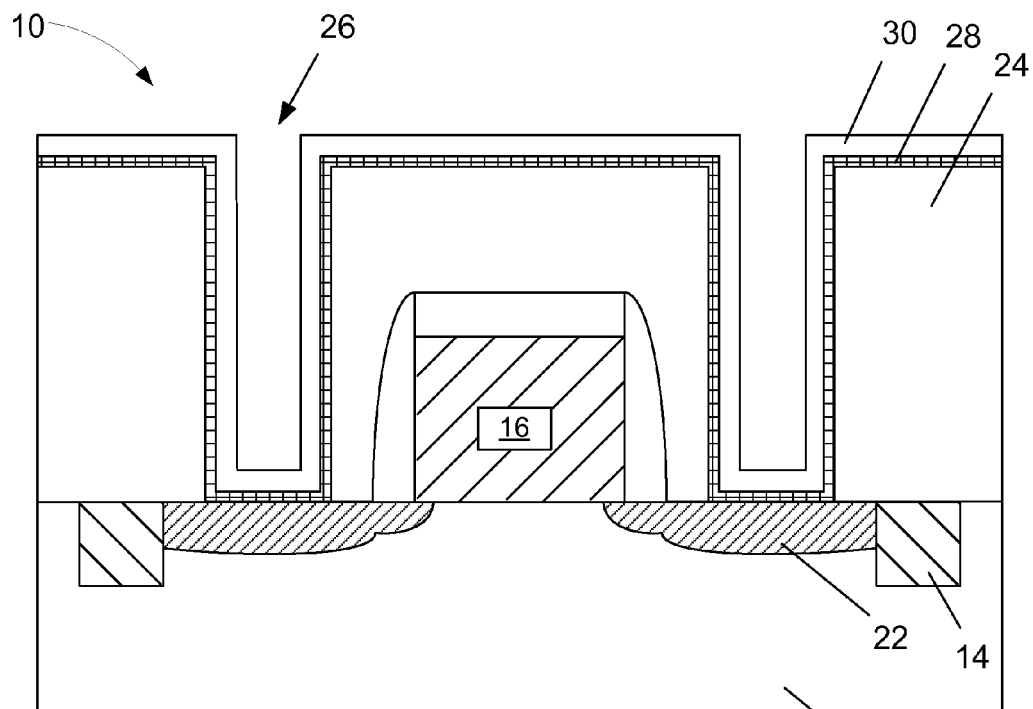

FIG. 1C depicts the device 10 after a layer of contact insulating material 28 (for the MIS contact) and a conductive material layer 30 were sequentially formed in the contact openings 26. In one illustrative embodiment, the layers 28, 30 may be formed by performing a conformal ALD or PVD process. The layer of contact insulating material 28 may be comprised of a variety of different materials, e.g., silicon nitride, a high-k insulating material (k value of 10 or greater), silicon oxynitride, etc., and it may be formed to any desired thickness, e.g., 0.5-2 nm. The conductive material layer 30 may be comprised of a variety of different materials, e.g., a metal, a metal alloy, polysilicon, etc., and it may be formed to any desired thickness, e.g., 2-8 nm. The conductive material layer 30, the layer of contact insulating material 28 and the source/drain region 22 provide the basic metal-insulator-semiconductor contact structure for the MIS contacts disclosed herein.

Figure 1D:
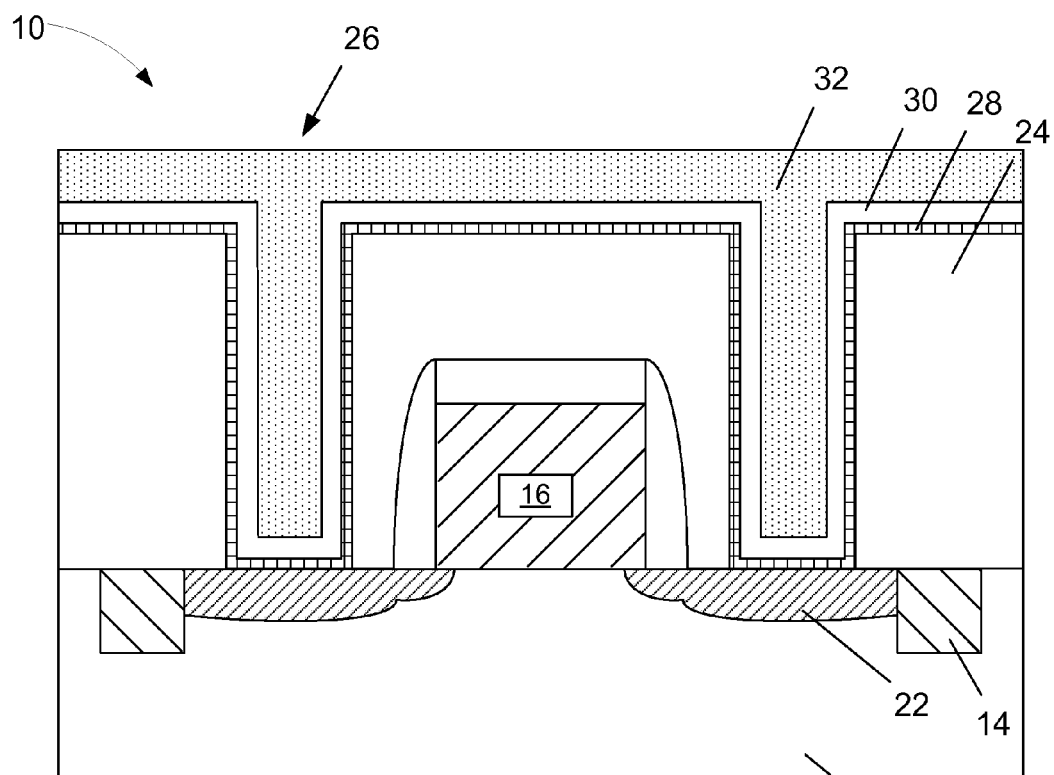

FIG. 1D depicts the device 10 after a sacrificial material layer 32 has been formed on the device 10. In one embodiment, the sacrificial material layer 32 is formed such that it overfills the contact openings 26 and its upper surface is positioned above the conductive material layer 30. In one illustrative embodiment, the sacrificial material layer 32 may be comprised of OPL (Optical Planarization Layer), DUO™ oxide, etc. and it may be formed using traditional techniques for forming such materials, e.g., spin-coating, deposition, etc.

Figure 1E:
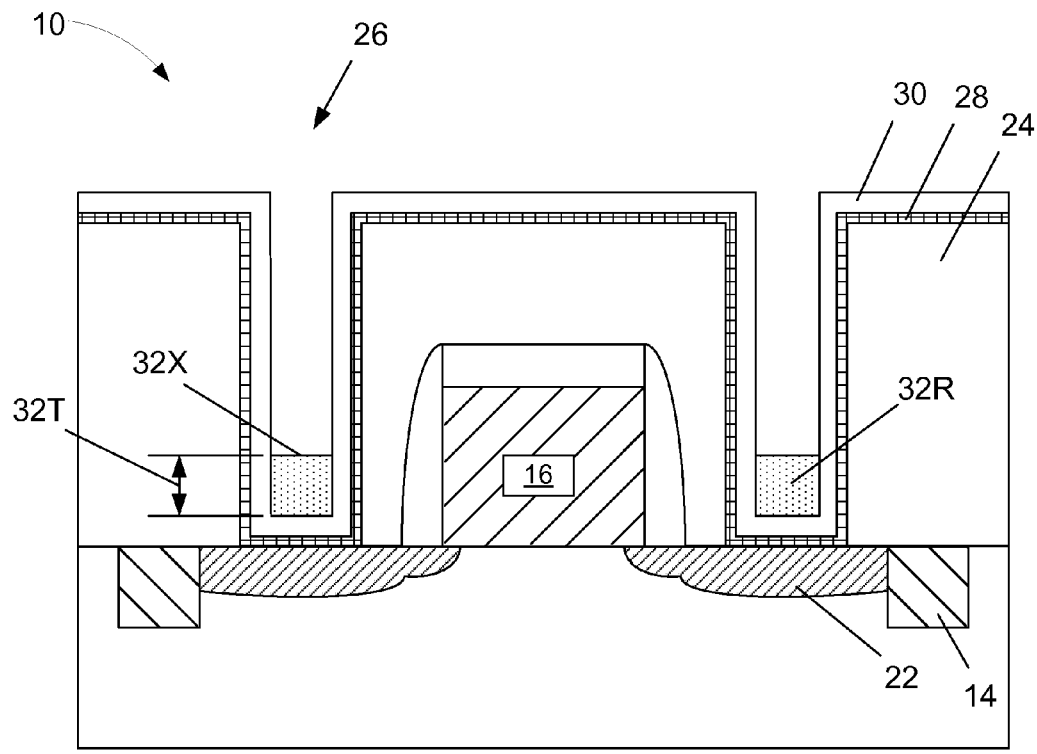

FIG. 1E depicts the device 10 after a recess etching process was performed on the sacrificial material layer 32 to define a recessed sacrificial material layer 32R with a recessed upper surface 32X. After such recessing, the recessed sacrificial material layer 32R exposes portions, but not all, of the conductive material layer 30. The amount of the recessing depends upon the particular application. In one illustrative embodiment, the recessed sacrificial material layer 32R may have a post-recessing thickness 32T that falls within the range of about 10-40 nm. In general, the recessed sacrificial material layer 32R should be recessed a sufficient amount so that sufficient portions of the conductive material layer 30 and the layer of contact insulating material 28 may be removed (as described more fully below).

Figure 1F:
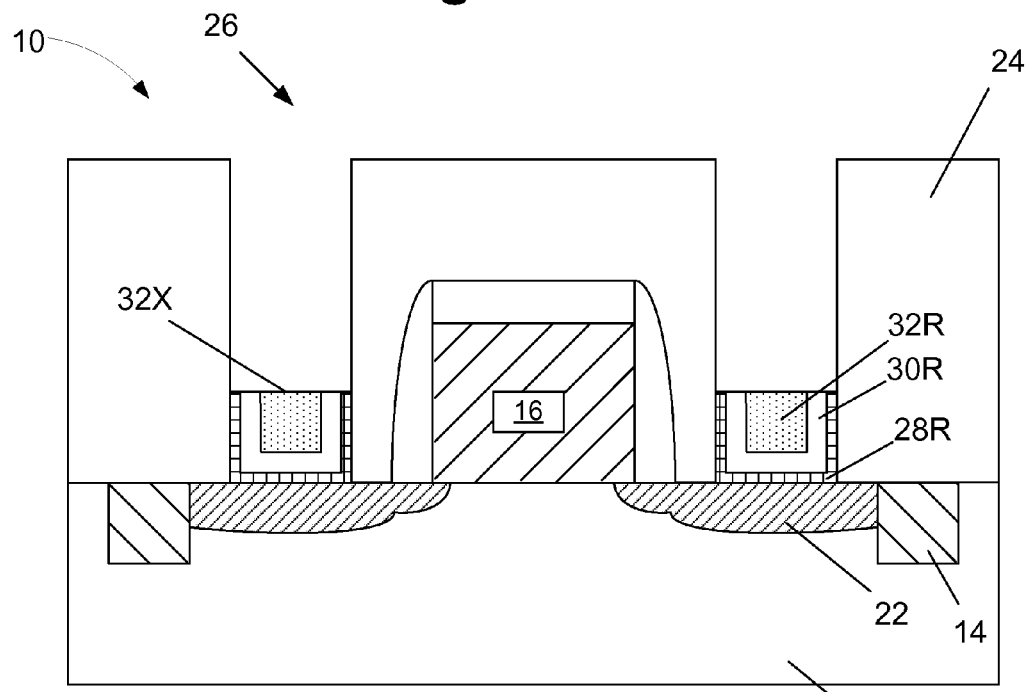

FIG. 1F depicts the device 10 after one or more timed etching processes were performed to remove portions, but not all, of the conductive material layer 30 and portions, but not all, of the layer of contact insulating material 28 positioned above the upper surface 32X of the recessed sacrificial material layer 32R. As depicted, the recessed sacrificial material layer 32R protects the underlying portions of the conductive material layer 30 and the layer of contact insulating material 28 during the etching process(es). By performing this recess etching process, portions of the layer of contact insulating material 28 and the conductive material layer 30 that are not needed for the proper functioning of the MIS contact structure may be removed from the contact openings 26, thereby making room for conductive materials (by removing the layer of insulating material 28) and/or perhaps the use of more conductive materials (by replacing the removed portions of the conductive material layer 30 with a more conductive material).

Figure 1G:
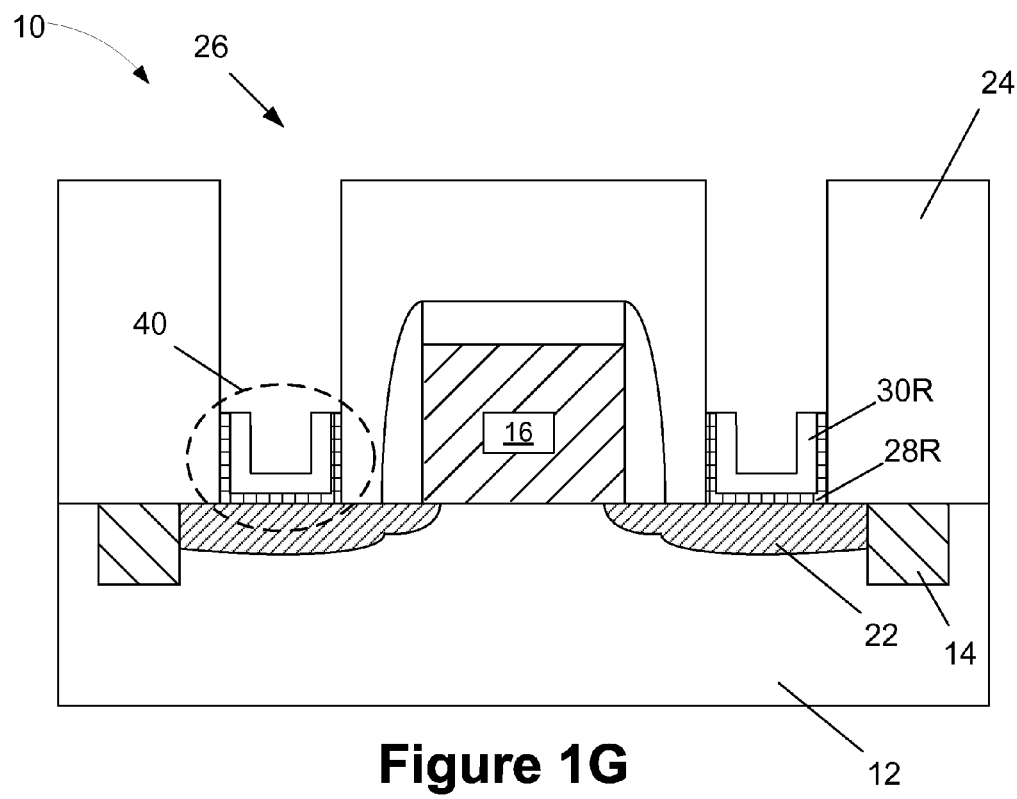

FIG. 1G depicts the device 10 after the remaining portions of the recessed sacrificial material layer 32R were removed. In one embodiment, such removal may be accomplished by performing a stripping or etching process, depending upon the material selected for the sacrificial material layer 32. The MIS contact structure 40 for the device 10 remains positioned in the contact openings 26. The MIS contact structure 40 includes a portion of the conductive material layer 30R and a portion of the layer of contact insulating material 28R. Note that the uppermost surfaces of the conductive material layer 30R and the layer of contact insulating material 28R are at approximately the same height level within the contact opening. Also note that both of the conductive material layer 30R and the layer of contact insulating material 28R have substantially U-shaped configurations at this point in the process flow, i.e., they both have substantially vertically oriented portions and a substantially horizontally oriented portion positioned between the substantially vertically oriented portions. The horizontal portion of the layer of contact insulating material 28R is positioned on the source/drain region 22, while the substantially vertically oriented portions of the layer of contact insulating material 28R are positioned on only portions of the vertical sidewalls of the contact opening 26.

Figure 1H:
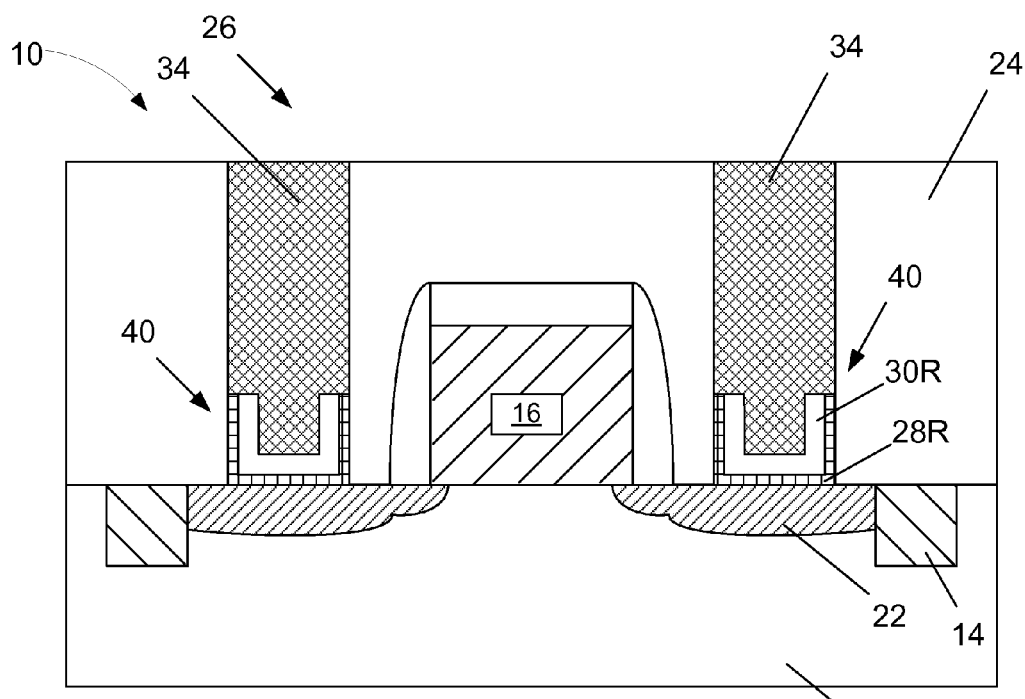

FIG. 1H depicts the device 10 after a plurality of illustrative conductive contact structures 34 have been formed in the contact openings 26 such that they are coupled to the MIS contact structures 40. That is, contact structures 34 contact at least the uppermost surfaces of the conductive material layer 30R and the layer of contact insulating material 28R. Also note that the contact structures 34 substantially fill the contact openings 26 above the uppermost surfaces of the layers 28R, 30R. The contact structures 34 are intended to be schematic and representative in nature, as they may be formed using any of a variety of different conductive materials and by performing traditional manufacturing operations. The contact structures 34 may also contain one or more barrier layers (not depicted). In one illustrative example, the structures 34 may be formed by depositing a liner, e.g., a titanium nitride liner, followed by overfilling the contact openings 26 with a conductive material, such as tungsten. Thereafter, a CMP process may be performed to planarize the upper surface of the layer of insulating material 24, which results in the removal of excess portions of the liner and the tungsten positioned above the layer of insulating material 24 outside of the contact openings 26 and the formation of the contact structures 34. As will be appreciated by those skilled in the art, although the formation of MIS contact structures 40 to the source/drain regions of the device has been depicted herein, the methodologies disclosed herein may be employed in forming MIS contact structures to other device regions, such as forming an MIS contact to a gate electrode structure or a resistor, a component of a bipolar transistor, a photonic device, other power devices, etc.

Figure 1I:
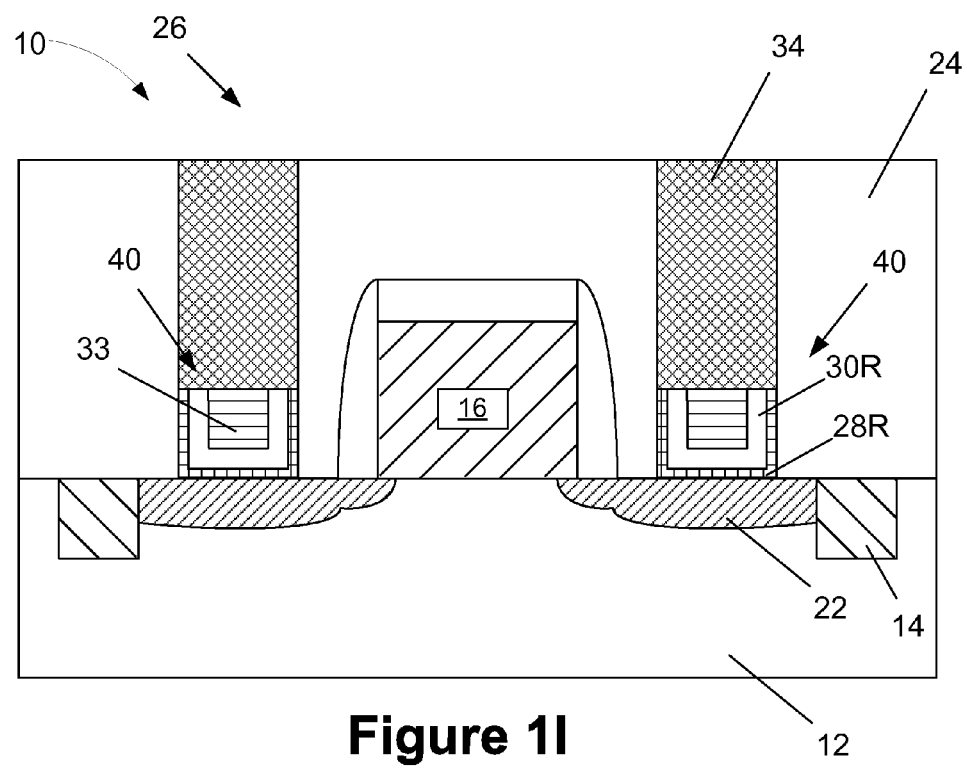

FIG. 1I depicts an embodiment wherein, in lieu of forming the sacrificial material 32, a non-sacrificial layer of conductive material 33 may be formed in the contact openings 26, and treated just as the sacrificial material layer 32, except that it is not removed. In this embodiment, the material of the non-sacrificial layer of conductive material 33 must be a conductive material with a high degree of etch selectivity relative to the conductive material layer 30, the layer of contact insulating material 28, and the layer of insulating material 24, so that the non-sacrificial layer of conductive material 33 may be initially recessed in the contact openings 26 and thereafter serve to protect the underling portions of the layers 30R, 28R, as described above for the recessed sacrificial material layer 32R. In one embodiment, the non-sacrificial layer of conductive material 33 may be comprised of at least some of the same materials as those used in forming the conductive contact structures 34. The non-sacrificial layer of conductive material 33 is provided with different shading in the drawings for purposes of explanation only. In this embodiment, the non-sacrificial layer of conductive material 33 need not be removed after the basic structure of the MIS contact 40 is formed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming an MIS contact structure, comprising:
    forming at least one layer of insulating material above a semiconductor layer;
    performing at least one contact opening etching process to form a contact opening in said at least one layer of insulating material that exposes a portion of said semiconductor layer;
    conformably depositing a layer of contact insulating material in said contact opening and on the exposed surface of said semiconductor layer;
    conformably depositing a conductive material layer on said layer of contact insulating material within said contact opening;
    forming a sacrificial material layer in said contact opening on said conductive material layer such that it overfills said contact opening;
    reducing a thickness of said sacrificial material layer so as to expose a portion, but not all, of said conductive material layer, wherein said reduced-thickness sacrificial material layer has an upper surface;
    performing at least one etching process to remove portions of said conductive material layer and said layer of contact insulating material positioned above said upper surface of said reduced-thickness sacrificial material layer so as to thereby define recessed portions of said conductive material layer and said layer of contact insulating material;
    removing said reduced-thickness sacrificial material layer; and
    forming a conductive contact in said contact opening that contacts said recessed portions of said conductive material layer and said layer of contact insulating material.

2. The method of claim 1, wherein said semiconductor layer comprises one of a source/drain region, a gate structure or a resistor.

3. The method of claim 1, wherein said layer of contact insulating material is comprised of one of silicon nitride, a high-k insulating material (k value of 10 or greater) or silicon oxynitride.

4. The method of claim 1, wherein said conductive material layer is comprised of one of a metal, a metal alloy or polysilicon.

5. The method of claim 1, wherein said sacrificial material layer is comprised of one of OPL or DUO™ oxide.

6. The method of claim 1, wherein said reduced-thickness sacrificial material layer has a thickness that falls within the range of about 10-40 nm.

7. A method of forming an MIS contact structure, comprising:
    forming at least one layer of insulating material above a semiconductor layer;
    performing at least one contact opening etching process to form a contact opening in said at least one layer of insulating material that exposes a portion of said semiconductor layer, wherein said contact opening has sidewalls;
    conformably depositing a layer of contact insulating material on said sidewalls of said contact opening and on said exposed surface of said semiconductor layer, wherein said layer of contact insulating material has substantially vertically oriented portions and a substantially horizontally oriented portion positioned between said substantially vertically oriented portions of said layer of contact insulating material;
    conformably depositing a conductive material layer on said layer of contact insulating material within said contact opening, wherein said conductive material layer has substantially vertically oriented portions and a substantially horizontally oriented portion positioned between said substantially vertically oriented portions of said conductive material layer;

performing at least one process operation to remove portions, but not all, of said vertically oriented portions of said conductive material layer and said vertically oriented portions of said layer of contact insulating material so as to thereby expose portions of said sidewalls of said contact opening, while leaving said horizontally oriented portion of said conductive material layer and said horizontally oriented portion of said layer of contact insulating material positioned within said contact opening above said semiconductor layer; and forming a conductive contact in said contact opening that contacts said conductive material layer and said layer of contact insulating material.

8. The method of claim 7, wherein performing said at least one process operation comprises:

forming a recessed sacrificial material layer in said contact opening on said conductive material layer;

with said recessed sacrificial material layer in position within said contact opening, performing at least one etching process to remove said portions, but not all, of said vertically oriented portions of said conductive material layer and said vertically oriented portions of said layer of contact insulating material so as to thereby expose portions of said sidewalls of said contact opening; and after performing said at least one etching process, removing said recessed sacrificial material layer.

9. The method of claim 7, wherein performing said at least one process operation comprises:

forming a recessed non-sacrificial conductive material layer in said contact opening on said conductive material layer; and with said recessed non-sacrificial conductive material layer in position within said contact opening, performing at least one etching process to remove said portions, but not all, of said vertically oriented portions of said conductive material layer and said vertically oriented portions of said layer of contact insulating material so as to thereby expose portions of said sidewalls of said contact opening;

wherein said step of forming said conductive contact in said contact opening comprises forming said conductive contact in said contact opening such that it contacts said non-sacrificial conductive material layer, said conductive material layer and said layer of contact insulating material.

10. A method of forming an MIS contact structure, comprising:

forming at least one layer of insulating material above a semiconductor layer;

performing at least one contact opening etching process to form a contact opening in said at least one layer of insulating material that exposes a portion of said semiconductor layer;

conformably depositing a layer of contact insulating material in said contact opening and on the exposed surface of said semiconductor layer;

conformably depositing a conductive material layer on said layer of contact insulating material within said contact opening;

forming a non-sacrificial conductive layer in said contact opening on said conductive material layer such that it overfills said contact opening;

reducing a thickness of said non-sacrificial conductive layer so as to expose a portion, but not all, of said conductive material layer, wherein said reduced-thickness non-sacrificial conductive layer has an upper surface;

performing at least one etching process to remove portions of said conductive material layer and said layer of contact insulating material positioned above said upper surface of said reduced-thickness non-sacrificial conductive layer so as to thereby define recessed portions of said conductive material layer and said layer of contact insulating material; and forming a conductive contact in said contact opening that contacts said recessed portion of said conductive material layer, said recessed portion of said layer of contact insulating material and said reduced-thickness non-sacrificial conductive layer.

11. The method of claim 10, wherein said semiconductor layer comprises one of a source/drain region, a gate structure or a resistor.

12. The method of claim 10, wherein said layer of contact insulating material is comprised of one of silicon nitride, a high-k insulating material (k value of 10 or greater) or silicon oxynitride.

13. The method of claim 10, wherein said conductive material layer is comprised of one of a metal, a metal alloy or polysilicon.

14. The method of claim 10, wherein said non-sacrificial conductive layer is comprised of one of a metal, a metal alloy or polysilicon.

\* \* \* \* \*